United States Patent
Huang et al.

(10) Patent No.: US 10,353,372 B2
(45) Date of Patent: Jul. 16, 2019

(54) MODULARIZED ELECTRIC COMBINATION DEVICE

(71) Applicants: Chun-Ming Huang, Hsinchu (TW); Chen-Chia Chen, Hsinchu (TW); Chien-Ming Wu, Hsinchu (TW)

(72) Inventors: Chun-Ming Huang, Hsinchu (TW); Chen-Chia Chen, Hsinchu (TW); Chien-Ming Wu, Hsinchu (TW)

(73) Assignee: NATIONAL APPLIED RESEARCH LABORATORIES, Hsinchu (TW)

( * ) Notice: Subject to any disclaimer, the term of this patent is extended or adjusted under 35 U.S.C. 154(b) by 0 days.

(21) Appl. No.: 15/821,830

(22) Filed: Nov. 23, 2017

(65) Prior Publication Data
US 2019/0107819 A1 Apr. 11, 2019

(30) Foreign Application Priority Data
Oct. 6, 2017 (TW) .............................. 106134621 A

(51) Int. Cl.
*G05B 19/07* (2006.01)
*H05K 7/02* (2006.01)
(Continued)

(52) U.S. Cl.
CPC ........... *G05B 19/07* (2013.01); *G05B 19/054* (2013.01); *H01R 13/207* (2013.01); *H05K 7/023* (2013.01);
(Continued)

(58) Field of Classification Search
CPC .................. G05B 19/07; G05B 19/054; G05B 2219/1215; H01R 13/207; H05K 7/023; H05K 7/1457
(Continued)

(56) References Cited

U.S. PATENT DOCUMENTS 6,008,678 A * 12/1999 Barber ............... H03K 3/35625
327/203
6,469,901 B1 * 10/2002 Costner ..................... G06F 1/18
361/730
(Continued)

OTHER PUBLICATIONS

Received STIC search report from EIC 2800 searcher Christian Miner dated Apr. 12, 2018.*

*Primary Examiner* — Nguyen Tran
*Assistant Examiner* — Htet Z Kyaw

(57) ABSTRACT

The device includes a master module and a slave module. The master module includes a control unit for controlling overall operation of the master module, a power unit electrically for storing electricity to supply the master module, an electricity transmission unit for receiving electricity from the power unit and wirelessly transmitting the electricity; and a communication unit for communicating of the master module. The slave module is electrically connected to the master module and includes a control subunit for controlling overall operation of the slave module, a communication subunit for wirelessly communicating with the communication unit, an electricity reception unit for wirelessly receiving the electricity from the power unit of the master module, a storage unit for storing electricity from the electricity reception unit and supplying power to each unit of the slave module, and an electricity transmission subunit for wirelessly outward transmitting electricity of the storage unit.

14 Claims, 5 Drawing Sheets

(51) Int. Cl.
   *H05K 7/14*       (2006.01)
   *G05B 19/05*      (2006.01)
   *H01R 13/207*     (2006.01)

(52) U.S. Cl.
   CPC ... *H05K 7/1457* (2013.01); *G05B 2219/1215* (2013.01)

(58) Field of Classification Search
   USPC .............................................. 363/72; 320/108
   See application file for complete search history.

(56) References Cited

U.S. PATENT DOCUMENTS

| | | | |
|---|---|---|---|
| 8,661,174 B2* | 2/2014 | Wang | G06F 13/382 710/110 |
| 8,767,885 B2* | 7/2014 | Sampath | H04B 1/1027 375/260 |
| 8,873,239 B2* | 10/2014 | McRae | G06F 1/1656 361/728 |
| 9,515,523 B2* | 12/2016 | Fujita | H04B 5/0037 |
| 9,563,219 B2* | 2/2017 | Heydron | G08C 17/02 |
| 9,794,679 B2* | 10/2017 | Wilker | H04R 1/026 |
| 9,930,708 B2* | 3/2018 | Kang | H04W 76/14 |
| 9,991,731 B2* | 6/2018 | Ichikawa | H02J 17/00 |
| 2002/0133305 A1* | 9/2002 | Chao | G01R 31/31721 702/60 |
| 2004/0097263 A1* | 5/2004 | Katayama | H04L 12/462 455/556.1 |
| 2009/0157929 A1* | 6/2009 | Pigott | G06F 13/4291 710/110 |
| 2011/0074833 A1* | 3/2011 | Murayama | A63H 33/042 345/690 |
| 2011/0175962 A1* | 7/2011 | Miura | B41J 29/38 347/19 |
| 2012/0014072 A1* | 1/2012 | Trussel | H01R 4/302 361/747 |
| 2012/0122059 A1* | 5/2012 | Schweikardt | A63H 33/04 434/118 |
| 2012/0135613 A1* | 5/2012 | Chatterjee | G06F 3/03543 439/39 |
| 2012/0235509 A1* | 9/2012 | Ueno | H02J 5/005 307/104 |
| 2013/0007178 A1* | 1/2013 | Nahidipour | H04L 67/1095 709/208 |
| 2013/0026848 A1* | 1/2013 | Ito | B60L 11/182 307/104 |
| 2014/0136742 A1* | 5/2014 | Ooyabu | G06F 13/364 710/110 |
| 2014/0274412 A1 | 9/2014 | Sabo et al. | |
| 2014/0300202 A1* | 10/2014 | Shimokawa | H02J 50/12 307/104 |
| 2014/0361738 A1* | 12/2014 | Lee | H02J 5/005 320/108 |
| 2015/0127862 A1* | 5/2015 | Fan | H04B 3/542 710/110 |
| 2015/0143007 A1* | 5/2015 | Fan | H04B 3/542 710/110 |
| 2015/0168185 A1* | 6/2015 | Huang | G01D 11/245 702/127 |
| 2015/0296282 A1* | 10/2015 | Fujioka | H04R 1/02 381/79 |
| 2015/0301974 A1* | 10/2015 | Lin | G06F 13/4068 710/300 |
| 2016/0129799 A1* | 5/2016 | Kwon | B60L 11/1829 320/108 |
| 2016/0149442 A1* | 5/2016 | Asanuma | H02J 50/60 307/104 |
| 2016/0193730 A1* | 7/2016 | Kawase | B25J 9/1674 700/249 |
| 2016/0249478 A1 | 8/2016 | Wang et al. | |
| 2016/0268815 A1* | 9/2016 | Lee | H02J 50/10 |
| 2016/0306759 A1* | 10/2016 | Ham | H04L 12/40143 |
| 2016/0344136 A1 | 11/2016 | Bdeir | |
| 2017/0150631 A1 | 5/2017 | Hu et al. | |
| 2017/0373434 A1* | 12/2017 | Susilo | H01R 13/6205 |
| 2018/0191207 A1* | 7/2018 | Asanuma | H02J 50/90 |

* cited by examiner

MODULARIZED ELECTRIC COMBINATION DEVICE

BACKGROUND OF THE INVENTION

1. Technical Field

The invention relates to electric devices, particularly to combinative and modularized electric device.

2. Related Art

Open-source hardware (OSH) has not been popular in a general market for a long time. One of the reasons is that a barrier to entry of the OSH is relatively high. As a result, major users of the OSH are professionals in electrical and electronic engineering field. Even those OSH products designed for children still have certain barriers to children.

To reduce barriers to developing this kind of OSH products, a typical solution is a product of electronic building blocks conjointly developed by LEGO® and the Massachusetts Institute of Technology (MIT). This product includes a core building block which contains a microcontroller. It included memory storage to store the firmware and user programs. Users can store a program in the RCX block and then connect to other blocks with sensors according to the required combination of the stored program. Besides the tangible combination of the building blocks, electric connections are also established between all building blocks.

However, the electric connections between building blocks of the abovementioned electronic building blocks need additional transmission lines or connectors to serve as bridges. This will cause limitations in use. Subsequent electronic building blocks or similar OSH structures still rely upon traditional connectors to make electric connections so as to limit the age group of users. As a result, these OSH products cannot be widely popular.

SUMMARY OF THE INVENTION

An object of the invention is to provide a modularized electric combination device, which utilizes a wireless manner to transmit power and signals to eliminate tangible electric contacts. As a result, an OSH product will be more water-resistant and robust and easy to be promoted to more age groups.

To accomplish to above object, the invention provides a modularized electric combination device including a master module and at least one slave module. The master module includes a control unit for controlling overall operation of the master module, a power unit electrically connected to the control unit for connecting an external power source and storing electricity to supply the master module, an electricity transmission unit electrically connected to the control unit and the power unit for receiving electricity from the power unit and wirelessly transmitting the electricity for power supply, and a communication unit electrically connected to the control unit for communicating of the master module. The slave module is electrically connected to the master module and includes a control subunit for controlling overall operation of the slave module, a communication subunit electrically connected to the control subunit for wirelessly communicating with the communication unit of the master module to create a communication channel, an electricity reception unit electrically connected to the control subunit for wirelessly receiving the electricity from the power unit of the master module, a storage unit electrically connected to the control subunit and the power reception unit for storing electricity from the electricity reception unit and supplying power to each unit of the slave module, and an electricity transmission subunit electrically connected to the storage unit for wirelessly outward transmitting electricity of the storage unit.

DETAILED DESCRIPTION OF THE INVENTION

Figure 1:
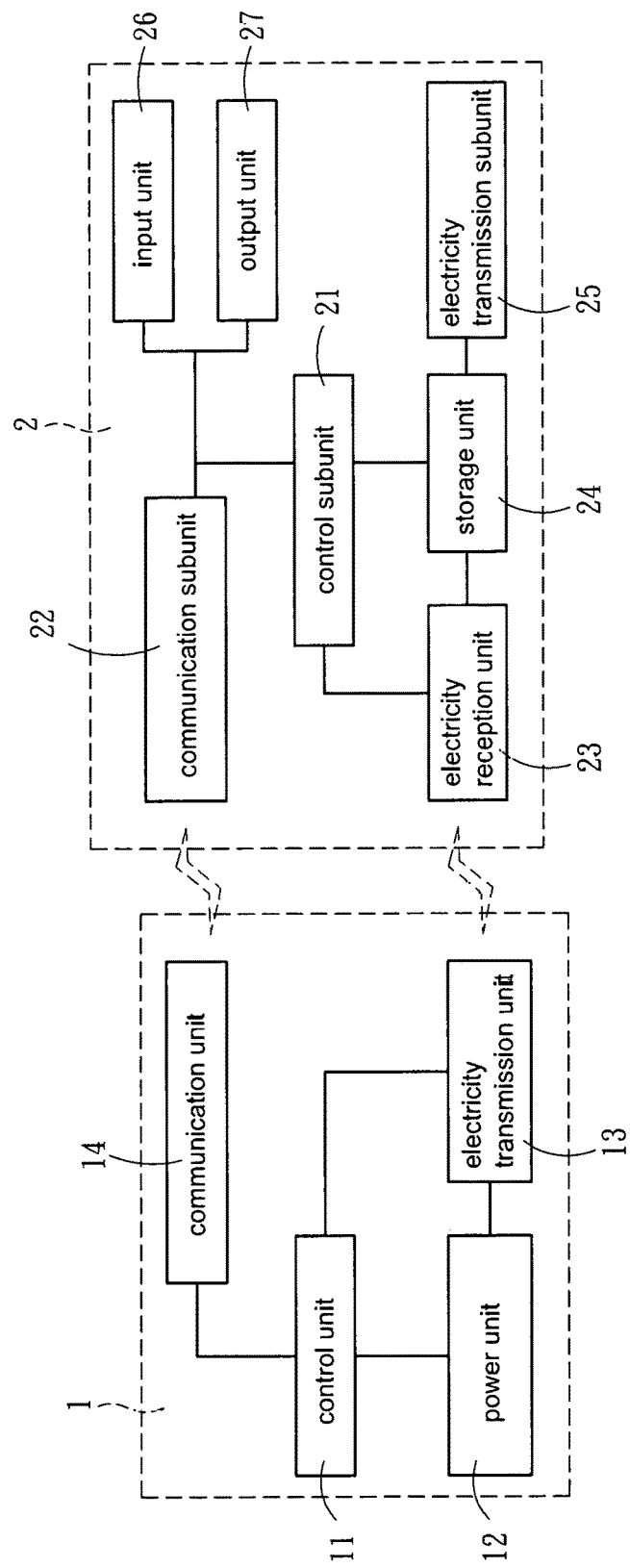
FIG. 1 is a systematic block diagram of the invention.

Please refer to FIG. 1, which is a systematic block diagram of the invention. As shown, the modularized electric combination device of the invention includes a master module 1 and at least one slave module 2. The master module 1 includes a control unit 11 for controlling overall operation of the master module 1 and detecting if the slave module 2 has made an electric connection or not. The control unit 11 may be a microcontroller. The control unit 11 is electrically connected to a power unit 12. The power unit 12 is used for connecting an external power source and storing electricity to supply the master module 1 and the slave modules connected thereto. The control unit 11 is also electrically connected to an electricity transmission unit 13. The electricity transmission unit 13 is electrically connected to the control unit 11 and the power unit 12 for receiving electricity from the power unit 12 and wirelessly transmitting the electricity to the slave module 2 for power supply. The control unit 11 is also electrically connected to a communication unit 14 serving as a communication channel with the master module 1, so that a data transmission channel can be established between the master module 1 and slave module 2, even can be established between the master module 1 and other external devices.

The slave module 2 is electrically connected to the master module 1 and includes a control subunit 21 for controlling overall operation of the slave module. The control subunit 21 may be a microcontroller. The control subunit 21 is electrically connected to a communication subunit 22 for wirelessly communicating with the communication unit 14 of the master module 1 to create a communication channel. In this embodiment, the communication channel between the communication subunit 22 and the communication unit 14 only involves data transfer without power transmission. Also, the control subunit 21 is electrically connected to an electricity reception unit 23 for wirelessly receiving the electricity from the electricity transmission unit 13 of the master module 1. The electricity reception unit 23 is electrically connected to a storage unit 24 which is also electrically connected to the control subunit 21. The storage unit 24 in this embodiment is a battery or capacitor for storing electricity from the electricity reception unit 23 and supplying power to each unit of the slave module 2. The storage unit 24 is electrically connected to an electricity transmission subunit 25 for wirelessly transmitting electricity of the storage unit 24 to other slave module 2. In addition, the control subunit 21 is electrically connected to an input unit 26 and an output unit 27. The input unit 26 may be a sensor or a switch and the output unit 27 may be a light emitting diode (LED), a display panel or a buzzer. The input unit 26 is used for generating inputting actions and sending input signals to the master module 1 and an external device through the communication subunit 22. The output unit 27 is controlled by control signals from the control subunit 21.

The control signals is entered by an external device and then sent to the communication subunit 22 and the output unit 27 to operate through the communication unit 14 of the master module 1.

Figure 2:
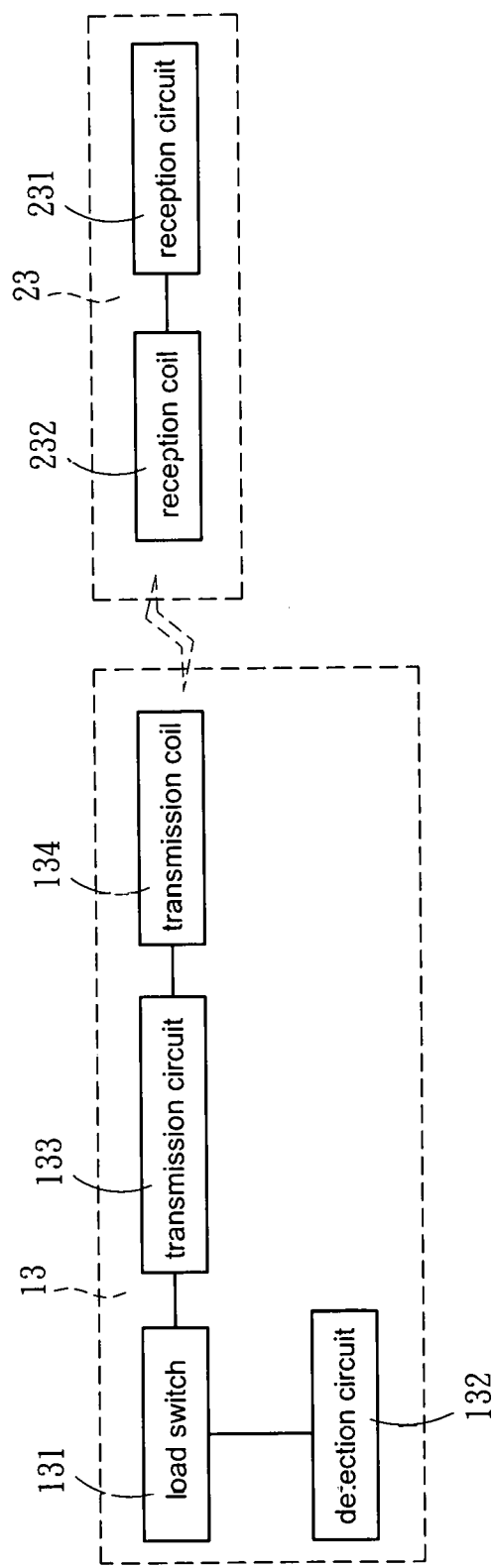
FIG. 2 is a partial block diagram of the invention.

Please refer to FIG. 2, which is a partial block diagram of the invention. As shown, the electricity transmission unit 13 of the master module 1 and the electricity reception unit 23 of the slave module 2 make power transmission through a wireless way. The electricity transmission unit 13 further includes a load switch 131 for switching on or off the electricity. The load switch 13 is electrically connected to a detection circuit 132 and a transmission circuit 133. The transmission circuit 133 is electrically connected to a transmission coil 134. The detection circuit 132 is a reception coil detection circuit. The detection will send out a signal to the load switch 131 to switch on for inputting electricity to the transmission circuit 133 and the transmission circuit 133 will wirelessly outward transmit the electricity through the transmission coil 134 when the detection circuit 132 detects the reception coil.

Figure 3:
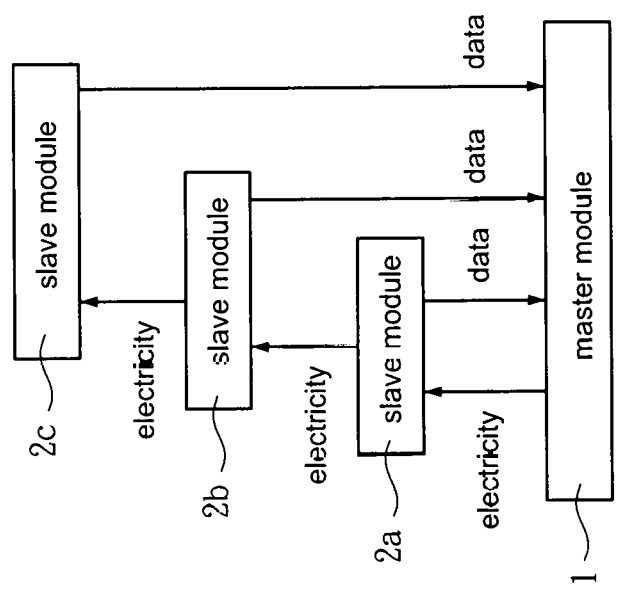
FIG. 3 is a transmission framework of power and data of the invention.

The electricity reception unit 23 of the slave module 2 further includes a reception circuit 231 and a reception coil 232 electrically connected to the reception circuit 231. The reception coil 232 will receive electricity and transfer to the reception circuit 231 after the reception coil 232 has matched the transmission coil 134. The reception circuit 231 converts AC power into DC power for subsequent electricity use or storage. In addition, the electricity transmission subunit 25 has the same circuit as the electricity transmission unit 13. The electricity transmission subunit 25 is used for transmitting electricity to a next slave module 2 electrically connected in the same manner so as to power each slave module 2 connected. As a result, as shown in FIG. 3, when the master module 1 and a plurality of slave modules 2a-2c have completed wireless connections, data of each slave module 2a-2c can be directly transmitted back to the master module 1. The power supply of each slave module 2a-2c is serially transmitted by the electricity transmission unit 13 of the master module 1 and the electricity reception unit 23 of the slave module 2. The electricity transmission subunit 25 of each of the slave modules 2 will transmit electricity to next slave module 2 electrically connected.

Figure 4:
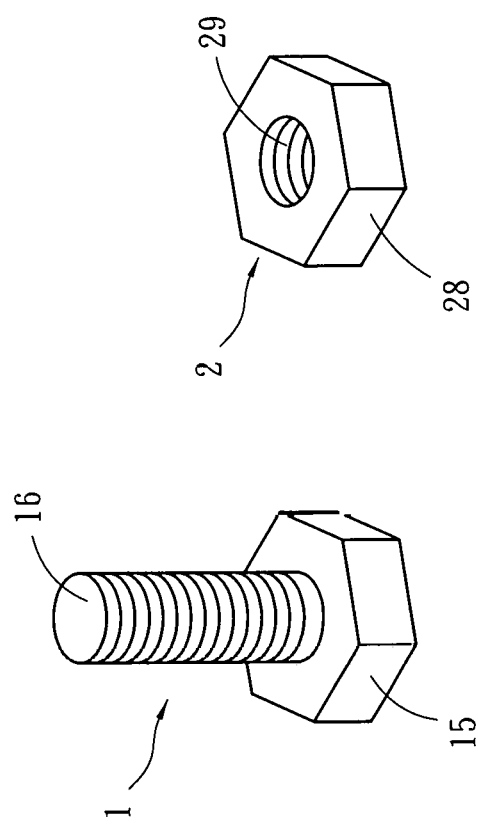
FIG. 4 is a structural schematic view of the invention.

Please refer to FIG. 4, which is a structural schematic view of the invention. As shown, in this embodiment, the master module 1 has a shape of screw with a head 15 and a threaded rod 16. The head 15 is used for receiving the master module 1. The threaded rod 16 extends from the head 15 and has a thread. The slave module 2 in this embodiment has a shape of nut. The slave module 2 has a hexagonal body 28. The input unit 26 and the output unit 27 may be disposed on a periphery of the body 28. A hole 29 with an inner thread is formed in the center of the body 28. Under this structure, the slave module 2 can be screwed with the master module 1 to create the abovementioned electric connections.

Figure 5:
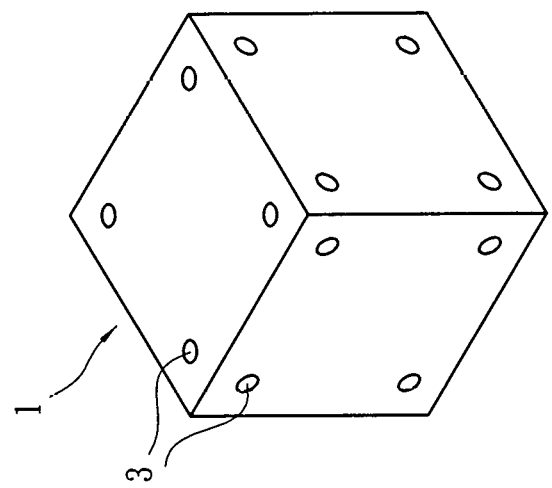
FIG. 5 is a structural schematic view of another embodiment of the invention.
Figure 5:
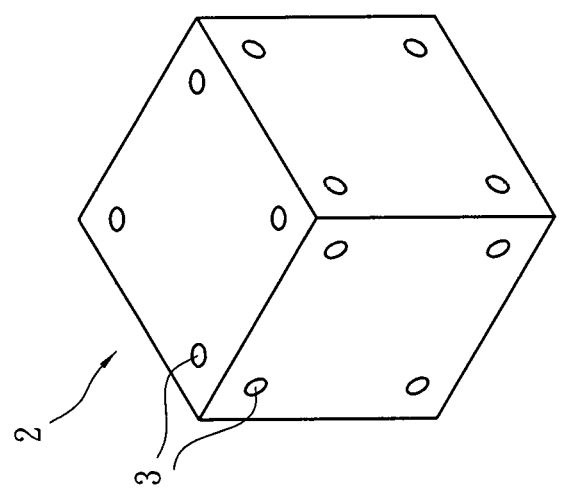

In addition, FIG. 5 shows a structural schematic view of another embodiment of the invention. Each of the master module 1 and slave module 2 is of a cubic shape. Each side or corner of each cuboid is embedded with a magnetic element 3. Under this structure, the slave module 2 and the master module 1 can be stacked up.

It will be appreciated by persons skilled in the art that the above embodiments have been described by way of example only and not in any limitative sense, and that various alterations and modifications are possible without departure from the scope of the disclosed example as defined by the appended claims.

What is claimed is:

1. A modularized electric combination device comprising:
   a master module comprising:
      a control unit for controlling overall operation of the master module;
      a power unit, electrically connected to the control unit for connecting an external power source and storing electricity to supply the master module;
      an electricity transmission unit, electrically connected to both the control unit and the power unit for receiving electricity from the power unit and wirelessly transmitting the electricity for power supply; and
      a communication unit, electrically connected to the control unit for communicating of the master module; and
   a slave module, electrically connected to the master module, and comprising:
      a control subunit for controlling overall operation of the slave module;
      a communication subunit, electrically connected to the control subunit for wirelessly communicating with the communication unit of the master module to create a communication channel;
      an electricity reception unit, electrically connected to the control subunit for wirelessly receiving the electricity from the electricity transmission unit of the master module;
      a storage unit, electrically connected to both the control subunit and the electricity reception unit for storing electricity from the electricity reception unit and supplying power to each unit of the slave module; and
      an electricity transmission subunit, electrically connected to the storage unit for wirelessly outward transmitting electricity of the storage unit;
   wherein the electricity transmission unit further comprises:
   a load switch for switching on or off the electricity;
   a detection circuit electrically connected to the load switch for sending out a signal to the load switch to switch on or off electricity;
   a transmission circuit electrically connected to the load switch for transmitting electricity; and
   a transmission coil electrically connected to the transmission circuit for wirelessly transmitting electricity.

2. The modularized electric combination device of claim 1, wherein the control unit is a microcontroller.

3. The modularized electric combination device of claim 1, wherein the storage unit is a battery or a capacitor.

4. The modularized electric combination device of claim 1, wherein the slave module further comprises an input unit electrically connected to the control subunit for generating inputting actions and sending input signals to the control subunit of the slave module.

5. The modularized electric combination device of claim 4, wherein the input unit is a sensor or a switch.

6. The modularized electric combination device of claim 1, wherein the slave module further comprises an output unit electrically connected to the control subunit for operating under a control signal from the control subunit.

7. The modularized electric combination device of claim 6, wherein and the output unit is a light emitting diode (LED), a display panel or a buzzer.

8. The modularized electric combination device of claim 1, wherein the detection circuit is a reception coil detection circuit.

9. The modularized electric combination device of claim 1, wherein the electricity reception unit of the slave module further comprises:
 a reception coil for receiving and transferring electricity after the reception coil has matched the transmission coil; and
 a reception circuit electrically connected to the reception coil for converting AC power into DC power for subsequent electricity use or storage.

10. The modularized electric combination device of claim 1, wherein the electricity transmission subunit has the same circuit as the electricity transmission unit.

11. The modularized electric combination device of claim 1, wherein the master module and the slave module have a shape of screw and a shape of nut, respectively.

12. The modularized electric combination device of claim 11, wherein the master module has a head and a threaded rod extending from the head, the head receives the master module, the threaded rod has a thread, and the slave module has a body and a hole with an inner thread so that the slave module is capable of being screwed with the master module.

13. The modularized electric combination device of claim 12, wherein the body is hexagonal.

14. The modularized electric combination device of claim 1, wherein each of the master module and slave module is of a cubic shape, each side of each cuboid is embedded with a magnetic element so that the slave module and the master module are capable of being stacked up.

* * * * *